(12) United States Patent  
Garmire et al.

(10) Patent No.: US 8,079,246 B2
(45) Date of Patent: Dec. 20, 2011

(54) INTEGRATED MEMS METROLOGY DEVICE USING COMPLEMENTARY MEASURING COMBS

(75) Inventors: David Garmire, Berkeley, CA (US); Hyuck Choo, Albany, CA (US); Richard S. Muller, Kensington, CA (US); James Demmel, Berkeley, CA (US); Sanjay Govindjee, Staefa (CH)

(73) Assignee: The Regents of the University of California, Oakland, CA (US)

( * ) Notice: Subject to any disclaimer, the term of this patent is extended or adjusted under 35 U.S.C. 154(b) by 1053 days.

(21) Appl. No.: 11/737,532

(22) Filed: Apr. 19, 2007

(65) Prior Publication Data

US 2009/0322365 A1 Dec. 31, 2009

Related U.S. Application Data

(60) Provisional application No. 60/793,424, filed on Apr. 19, 2006.

(51) Int. Cl.
*G01P 21/00* (2006.01)
(52) U.S. Cl. .................. 73/1.79; 73/504.14; 73/514.32; 324/750.3

(58) Field of Classification Search .................. 73/1.79, 73/1.38, 504.14, 514.32; 324/750.3
See application file for complete search history.

(56) References Cited

U.S. PATENT DOCUMENTS

| 7,152,474 B2* | 12/2006 | Deb et al. ................... 73/514.32 |
| 7,573,022 B2* | 8/2009 | Choo et al. ................... 250/234 |
| 2004/0113647 A1* | 6/2004 | Deb et al. ...................... 324/763 |

* cited by examiner

*Primary Examiner* — Daniel Larkin
(74) *Attorney, Agent, or Firm* — Kilpatrick Townsend and Stockton LLP (57) ABSTRACT

The present invention provides a device for in-situ monitoring of material, process and dynamic properties of a MEMS device. The monitoring device includes a pair of comb drives, a cantilever suspension comprising a translating shuttle operatively connected with the pair of comb drives, structures for applying an electrical potential to the comb drives to displace the shuttle, structures for measuring an electrical potential from the pair of comb drives; measuring combs configured to measure the displacement of the shuttle, and structures for measuring an electrical capacitance of the measuring combs. Each of the comb drives may have differently sized comb finger gaps and a different number of comb finger gaps. The shuttle may be formed on two cantilevers perpendicularly disposed with the shuttle, whereby the cantilevers act as springs to return the shuttle to its initial position after each displacement.

20 Claims, 13 Drawing Sheets

INTEGRATED MEMS METROLOGY DEVICE USING COMPLEMENTARY MEASURING COMBS

CROSS REFERENCE TO RELATED APPLICATIONS

This application claims the benefit of priority from U.S. provisional patent application No. 60/793,424, filed Apr. 19, 2006, the entirety of which is incorporated herein by reference.

STATEMENT AS TO RIGHTS TO INVENTIONS MADE UNDER FEDERALLY SPONSORED RESEARCH AND DEVELOPMENT

This invention was made with Government support under NSF Grant Nos. EIA-0122599 and EEC-0318642. The Government has certain rights to this invention.

BACKGROUND OF THE INVENTION

The present invention relates to a Micro-Electromechanical System (MEMS) metrology device and techniques for using the device to measure geometric, dynamic, and material properties of MEMS devices.

MEMS devices are known. MEMS devices typically include a two-and-one-half dimension (2.5D) structure that has movable and anchored portions. A common MEMS device having such a structure is a MEMS accelerometer such as the NASA Electronic Part and Package (NEEP) 2001. Such a device includes a generally planar structure having one or more beams, one or more springs, stationary polysilicon fingers and capacitive sense plates. Such devices are made from poly or single crystal silicon as well as from SiGe and SiC and other silicon-based materials. It has been determined that the performance of such devices changes in time due in part to changes in their material properties, which result in part from changes in thermal and load or shock cycles. There is therefore a need for monitoring the changes in material and geometric properties of MEMS devices.

In the CMOS world E-test devices are available that allow for various in-situ measurements. For example, E-test resistivity bridges can be used to measure resistivities. Also, E-test devices are available for the in-situ measurement of device line widths. So, while in the CMOS world E-test devices are available that can be incorporated in the masks used to manufacture the CMOS devices, no such equivalent in-situ device exists in the MEMS world. This lack of in-situ measurement capability for MEMS devices is further complicated due to the fact that MEMS devices are movable and that an aspect of their related measurement is directed to measuring the mechanical properties of the MEMS devices.

Various approaches are currently available for the measurement of parameters related to MEMS devices. Some of these approaches involve the use of Scanning Electron Microscopy (SEM), optical microscopy, interferometry, surface profileometry and nanoindentation. These approaches tend to be very expensive to implement requiring the use of expensive equipment and highly qualified operators. Another known test is the M-test, which involves using a test chip having arrays of cantilevered beams that are electrostatically actuated. Such a test is sensitive to process variations and cannot measure geometric properties, such as the line width of the device. Another test uses the out-of-plane bending of a cantilevered beam. This test is however restricted to the measurement of out-of-plane characteristics of a beam.

There is therefore a need for a tool for monitoring the material and geometric properties of MEMS devices that does not suffer from the above shortcomings.

BRIEF SUMMARY OF THE INVENTION

The present invention provides a device for in-situ monitoring of material, process and dynamic properties of a MEMS device. The monitoring device includes a pair of comb drives; a cantilever suspension comprising a translating shuttle operatively connected with the pair of comb drives; structures for applying an electrical potential to the comb drives to displace the shuttle; structures for measuring an electrical potential from the pair of comb drives; measuring combs configured to measure the displacement of the shuttle; and structures for measuring an electrical capacitance of the measuring combs. Each of the comb drives may have differently sized comb finger gaps and a different number of comb finger gaps. The shuttle may be formed on two cantilevers perpendicularly disposed with the shuttle, whereby the cantilevers act as springs to return the shuttle to its initial position after each displacement.

In another aspect, the present invention provides a method for monitoring of material, process and dynamic properties of a MEMS device. The methods includes forming the above described monitoring device adjacent to the MEMS device. A first one of the comb drives is actuated to displace the shuttle and an electrical capacitance of the measuring combs is used to determine when the displacement of the shuttle has reached a set distance. A first electrical potential placed on the first comb drive to accomplish the displacement of the shuttle by the set distance is measured. A second one of the comb drives is actuated to displace the shuttle and the electrical capacitance of the measuring combs is used to determine when the displacement of the shuttle has reached the set distance. A second electrical potential placed on the second comb drive to accomplish the displacement of the shuttle by the set distance is measured. Moreover, an electrical capacitance of the first comb drive may be measured while the second comb drive is displacing the shuttle by the set distance.

The embodiments of the present invention enable the in-situ monitoring of material, process and dynamic properties of MEMS devices. The MEMS metrology devices of the present invention enable a nondestructive metrology scheme, are inexpensive and thus are deployable in arrays. They are also compact in size and so are ideal for on-chip integration and thus can be constructed in close proximity to the MEMS devices being monitored. In addition, the MEMS metrology devices in accordance with the embodiments of the present invention provide for accurate measurements and monitoring of material, process and dynamic properties of MEMS devices.

For a further understanding of the nature and advantages of the invention, reference should be made to the following description taken in conjunction with the accompanying figures. It is to be expressly understood, however, that each of the figures is provided for the purpose of illustration and description only and is not intended as a definition of the limits of the embodiments of the present invention.

BRIEF DESCRIPTION OF THE DRAWINGS

FIG. 2 also shows the complementary comb-drive that is used for increasing measurement sensitivity.

DETAILED DESCRIPTION OF THE INVENTION

Figure 1:
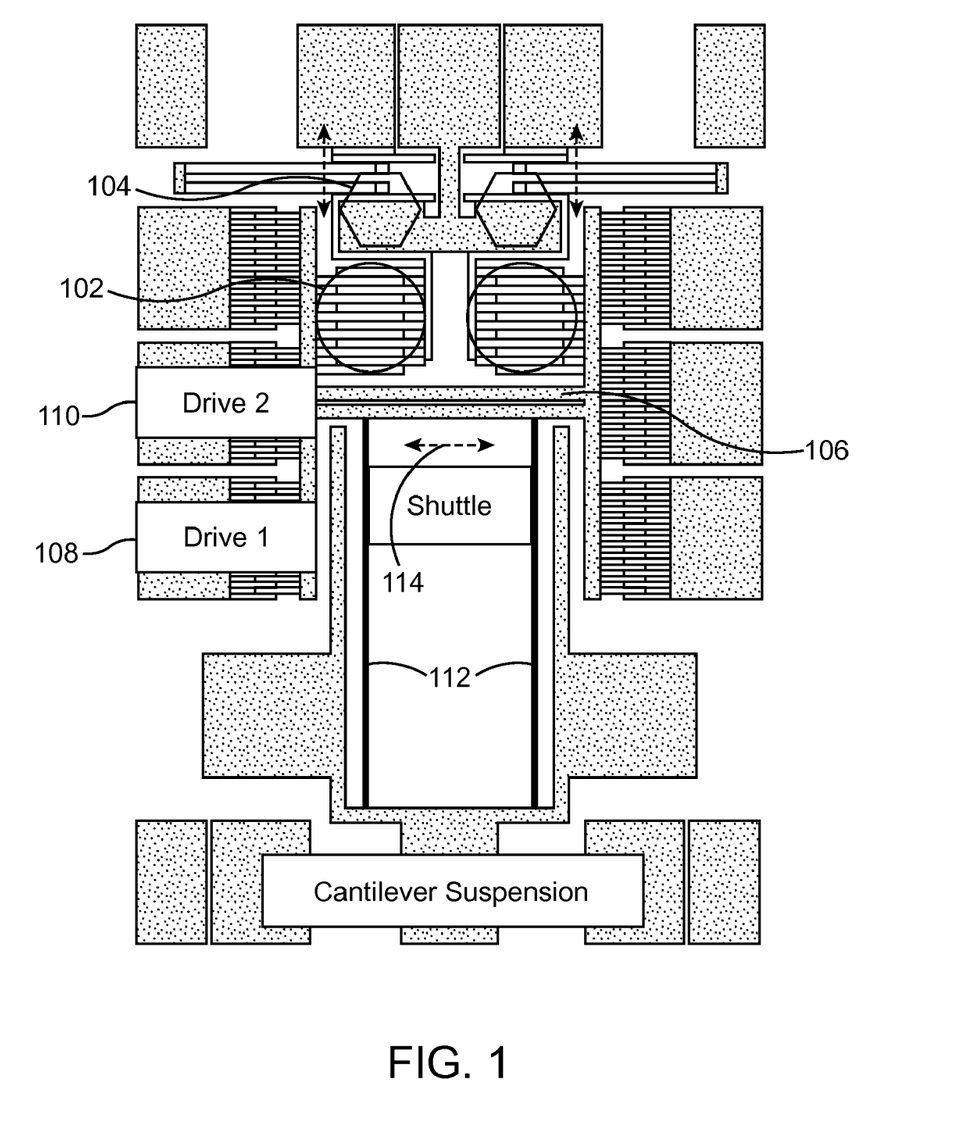
FIG. 1 shows a device layout of a MEMS metrology device in accordance with the embodiments of the present invention.
Figure 2:
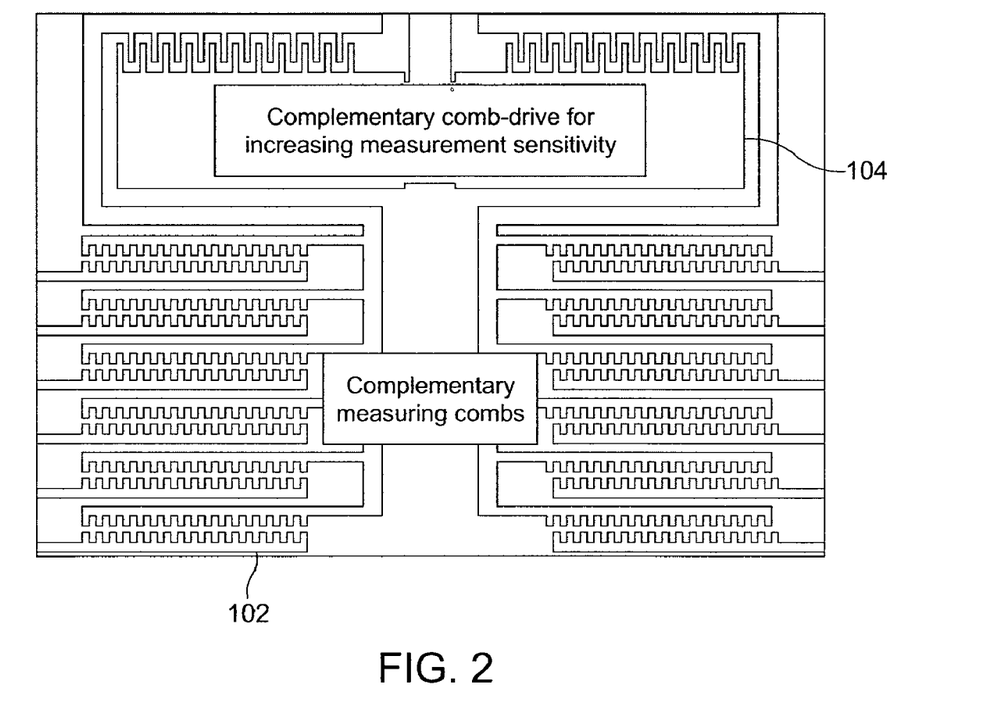
FIG. 2 is a detail view of the complementary measuring combs of the device of FIG. 1.
Figure 2A:
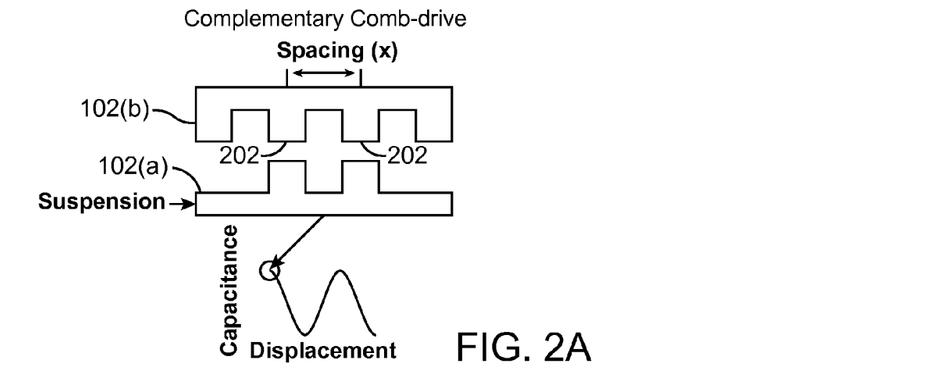
FIGS. 2A-F are simplified drawings showing the relative movement of the measuring combs 102 and the varying capacitance vs. displacement for measuring combs.
Figure 2B:
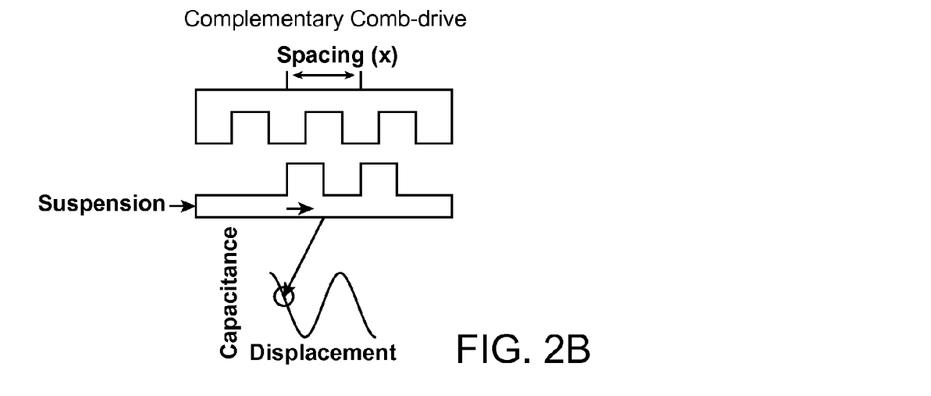
Figure 2C:
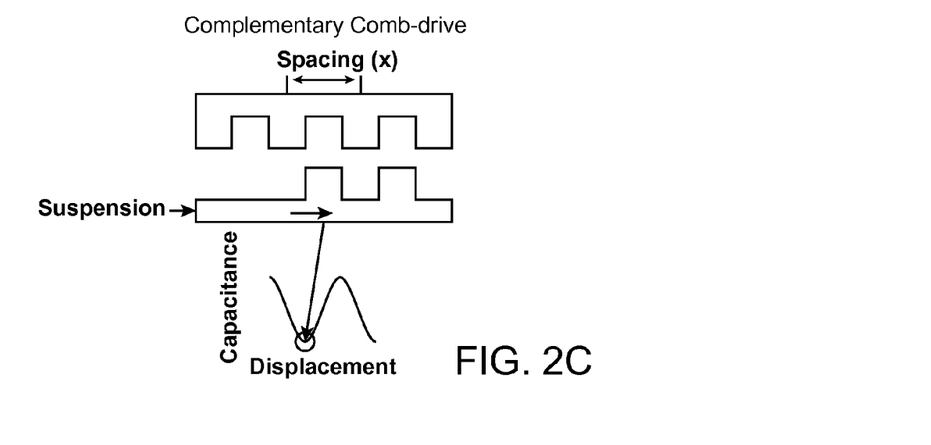
Figure 2D:
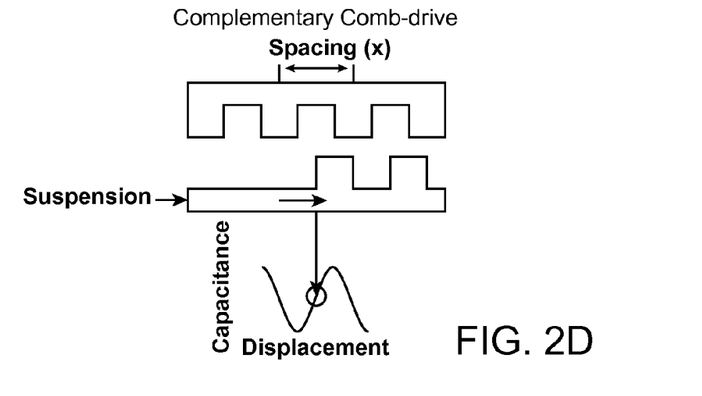
Figure 2E:
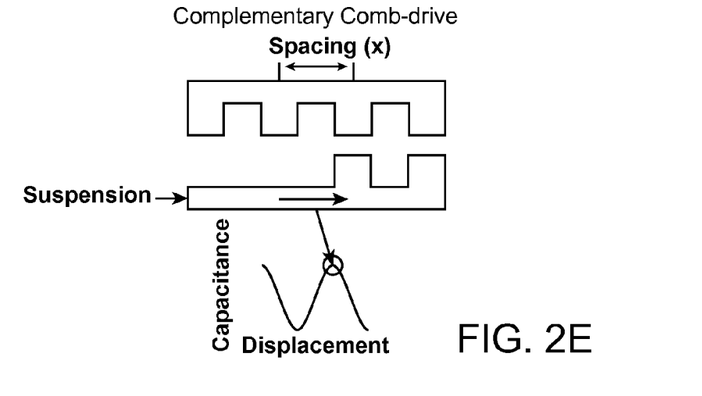

FIG. 1 shows a device layout of a MEMS metrology device in accordance with an embodiment of the present invention. FIG. 2 is a detail view of the complementary measuring combs 102 of the device of FIG. 1. FIG. 2 also shows the complementary comb-drive 104 that is used for increasing measurement sensitivity. In the device of FIG. 1, capacitance changes across the measuring combs 102 correspond with the lateral translation of the shuttle 106 as it is actuated by the comb-drives (e.g., drives 108 and 110). The device of FIG. 1 can be a compact device, fitting inside a 1 mm by 1 mm square or smaller, that can accurately measure in-plane over- or under-cut, effective Young's Modulus, and the comb-drive force for the material and process in which it is made. This device is useful for nanoscale calipers, manipulators, and force gauges, as well as for the scientific exploration of physical forces, developing fabrication processes, calibrating simulations of devices, and automatically recalibrating MEMS devices for environmental changes. Details of the complementary measuring combs 102 are shown in FIG. 2. As used herein over- or under-cut refer to a deviation of a fabricated gap from its designed value.

In one embodiment, the procedure for measuring over- or under- cut, Young's Modulus, and the comb-drive force involves displacing the central cantilevered suspension 112 with the comb-drives 108 and 110 and measuring the deflection amount (x) with the complementary measuring combs 102. For example, in connection with FIG. 1, two of the comb-drives 108 and 110 are actuated, which causes the cantilevers 112 to deflect and translate in the lateral direction 114 by deflection amount (x). Cantilevers 112 may act as springs that bias the shuttle 106 back to its original position after each displacement driven by the comb-drives. Using the measuring combs 102 to measure the deflection amount (x), the over- or under-cut can be determined. In order to increase the sensitivity of the measuring combs 102, they can be driven closer together with the secondary measuring comb drive 104. Then, by actuating one of the comb-drives (e.g., drive 108) and measuring the capacitance change with the other comb-drive (e.g., drive 110), the fringing field correction factor can be obtained for accurately determining the comb-drive force.

And, by assuming a uniform over- or undercut, the effective Young's Modulus of the system can be obtained. When over- or under-cut varies as a function of beam width and beam gap, then the same measurements may be repeated for several different comb-drives each with varying beam width and gaps.

Figure 2F:
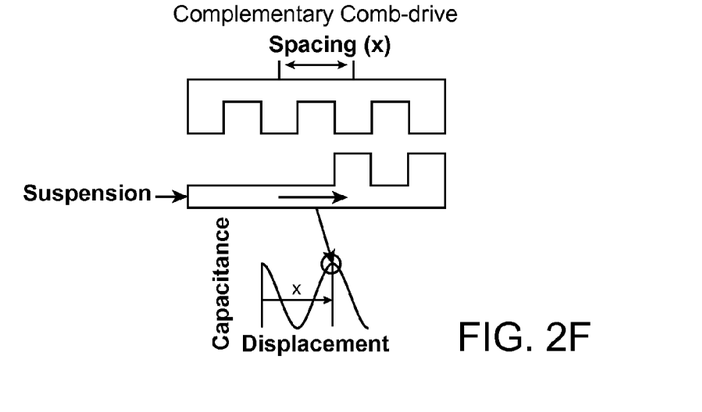
Figure 2G:
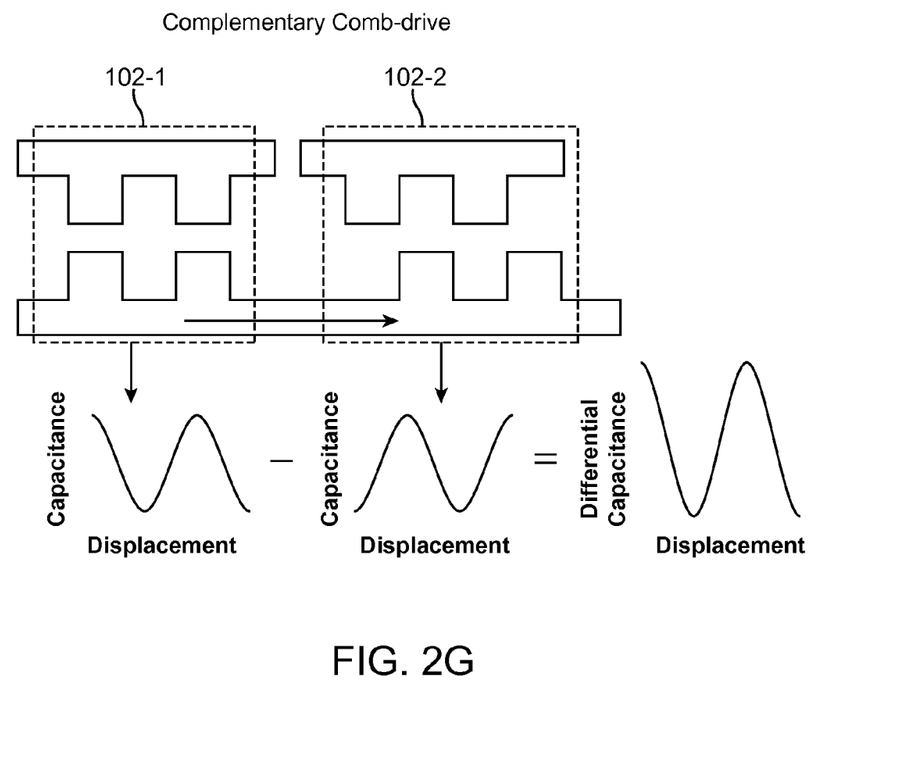
FIG. 2G is a simplified drawing showing how the differential capacitance of the complementary comb drive is measured.

FIGS. 2A-F show simplified drawings of the relative movement of the complementary measuring combs 102 and the varying capacitance vs. displacement for the combs 102. As is shown in FIGS. 2A-F, as the central suspension 102a is displaced (corresponding to the displacement of shuttle 106), the capacitance value of the combs 102 varies from a maximum value (FIG. 2A) to a minimum value (FIG. 2C) and back to a maximum value (FIG. 2F). As is shown in FIG. 2F, the spacing between comb fingers 202 can be measured as the displacement corresponding to the peak capacitance values. FIG. 2G is a simplified drawing that extends the concept of FIGS. 2A-F to demonstrate that differential capacitance of the complementary comb drive can be measured as the difference in capacitance between two sets of measuring combs 102-1 and 102-2.

A more detailed description of the method described above follows. First, the measuring combs 102 are used to find what applied voltages, $V_1$ and $V_2$, on two separate comb drives 108 and 110, will allow the cantilever 112 to displace by a fixed amount, (x). The comb drives 108 and 110 can have different gap sizes between comb fingers, $g_1$ and $g_2$, and possibly different number of drive finger gaps, $N_1$ and $N_2$.

The over- or under-cut, (e), may be calculated as:

$$e = (N_1 V_1^2 g_2 - N_2 V_2^2 g_1)/(N_1 V_1^2 - N_2 V_2^2).$$

Alternatively, (e) can be determined by finding the scale factor, (S), applied to $V_2$, to match the measuring comb's capacitive profile for the second comb drive (e.g., drive 110) with that of the first comb drive (e.g., drive 108). Then, $$e = (S^2 N_1 g_2 - N_2 g_1)/(S^2 N_1 - N_2).$$

The fringing field factor (a) can then be determined by driving the second comb drive (e.g., drive 110) to (x) and measuring the change of capacitance, (C), on the first comb drive (e.g., drive 108):

$$a = C(g_1 - e)/(x N_1 \epsilon_0 \epsilon_{air} h), \text{ where (h) is the thickness of the silicon.}$$

Next for a uniform over- or under-cut, the effective Young's Modulus, (E), of the silicon is found by:

$$E = CV_1^2 (L-e)^3/(4x^2 h(w+e)^3),$$

where (w) is the width of the cantilever beams 112 and (L) is the length of the cantilever beams 112.

Multiple comb drives (e.g., drives 108, 110) may be used to verify the over- or under-cut for beams and gaps of different sizes.

To improve the accuracy of the pair of complementary combs 102 for measuring capacitance changes, one set of the complementary combs 102 (shown in FIG. 2) can be offset (as shown in FIG. 2G). With the one offset pair of complementary combs 102-2, the capacitance of one pair of combs can reach a maximum when the other pair (e.g., combs 102-1) reaches a minimum as the shuttle 106 is actuated. This allows a differential sense circuit to be used to measure the capacitance difference between the pair of complementary combs 102-1 and 102-2.

A design layout, circuits, and measurement steps used for characterizing over- or under-cut, effective Young's Modulus, and comb-drive forces using the MEMS metrology device in accordance with the embodiments of the present invention is described below. The components of the characterization device are labeled in Design Layout section. The measurement circuit and set-up are shown in the Circuit Layout section. The measurement procedures are shown in Measurements section.

Design Layout

Overall Design

Figure 3:
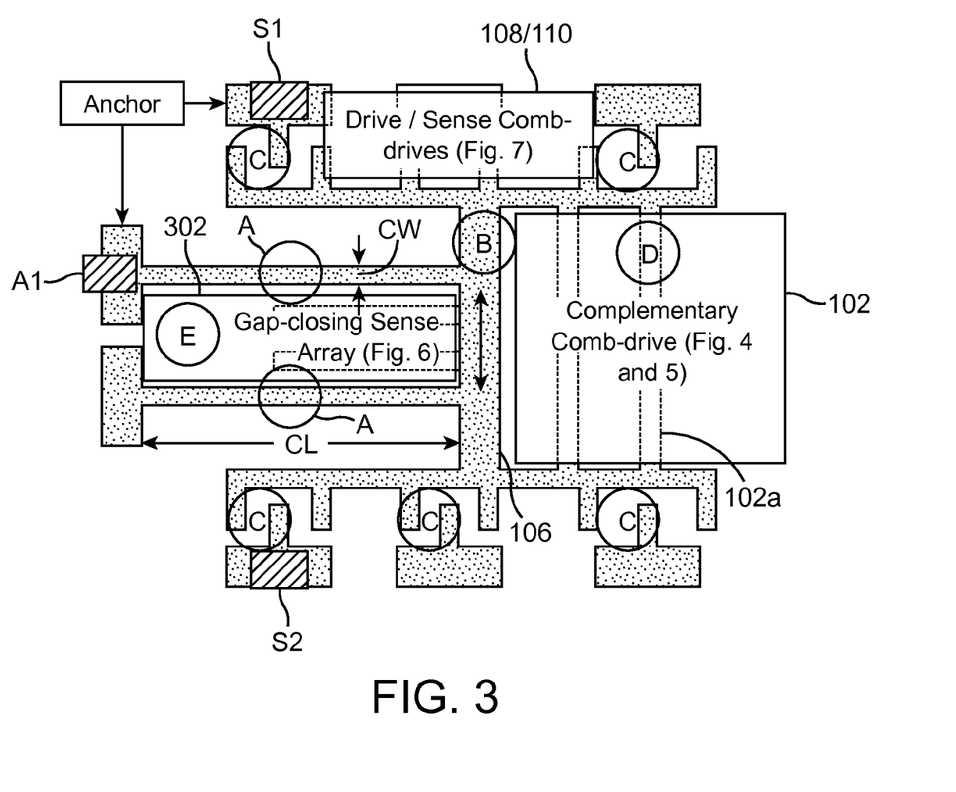
FIG. 3 is an exemplary schematic diagram of an embodiment of the device of FIG. 1.

FIG. 3 shows an exemplary schematic diagram of an embodiment of the device of FIG. 1. In FIGS. 3-9, electrical terminals are shown as cross-hatched boxes (e.g., terminals A1, S1, and S2 of FIG. 3). As can be seen, the design includes the following components or subsystems:

A. an anchored guided suspension 112 with cantilever width, cw, and cantilever length, cl,
B. a shuttle 106 that joins the suspension 112 and the driving and sensing apparatus,
C. a set of driving and sensing comb-drives 108/110,
D. measuring combs 102 to sense displacement of the shuttle 106, and
E. an optional gap-closing sense array 302 for further assessing cut-error.

The following guidelines can be used in the overall design of the device. The width of the guided suspension 112, cw, can be chosen as small as possible to keep the required length of the guided suspension, cl, as low as possible. When the beam-anchor compliance is being studied, the second structure should contain another guided suspension of a different width, a good value may be cw*1.25 (this doubles the stiffness) but the optimal value may depend on the process. The length of the guided suspension 112, cl, should be chosen small enough that processing steps will not break it, stiction will not immobilize it, and it will fit in the desired amount of space. cl should be chosen large enough that the shuttle 106 may move far enough (without breaking the suspension) that the measuring combs 102 senses a capacitive peak. Also, cl should be chosen large enough that the required voltage to achieve the desired displacement (x) of the shuttle 106 is kept small enough for the equipment to handle. The shuttle 106 should be kept as stiff as possible while still being releasable. For improved sensitivity and simplicity, driving and sensing comb-drives (e.g., drives 108/110) should be matched on both sides of the shuttle 106. When measuring cut-errors for many different geometries, it may be more economical to use differing comb-drive dimensions for comb-drives located on opposite sides.

Complementary Measuring Comb Design

Figure 4:
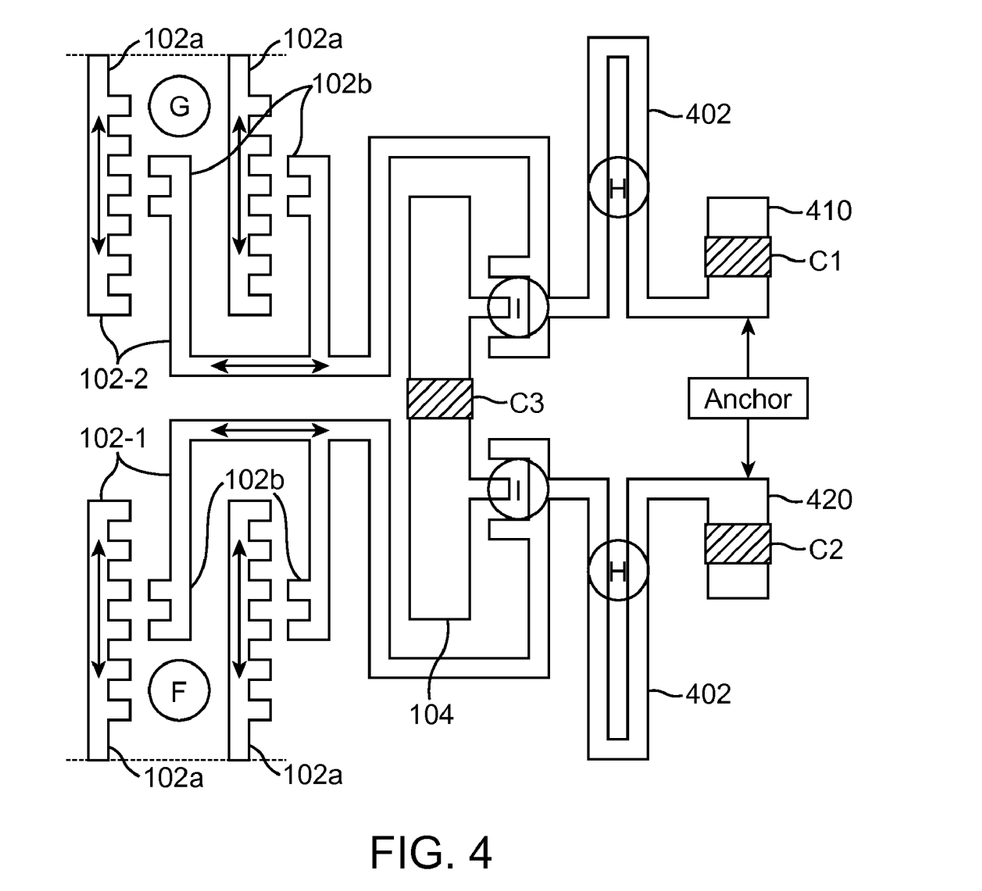
FIG. 4 is an exemplary schematic diagram of one embodiment of the measuring combs of FIG. 3.

FIG. 4 shows an exemplary schematic diagram of one embodiment of the measuring combs 102 of FIG. 3. Vertical members 102a in FIG. 4 correspond with the vertical members 102a of FIG. 3. Electrical terminals C1 and C2 are located adjacent anchors 410 and 420, respectively. Terminal C3 is located within comb drive 104. As shown in FIG. 4, the design of the measuring combs 102 includes the following:

F. one set of matched teeth 102-1,
G. one set of mismatched teeth 102-2,
H. suspensions 402 that allow the teeth sets to be moved towards each other by moving combs 102b, and
I. comb-drive 104 to actuate the suspensions 402.

The following guidelines can be used in the overall design of the device of FIG. 4. The set of matched teeth 102-1 and mismatched teeth 102-2 should have the same spacing between comb teeth. In addition, the suspension drive 104 may be joined or separated depending on whether more simplicity or flexibility is needed.

Figure 5:
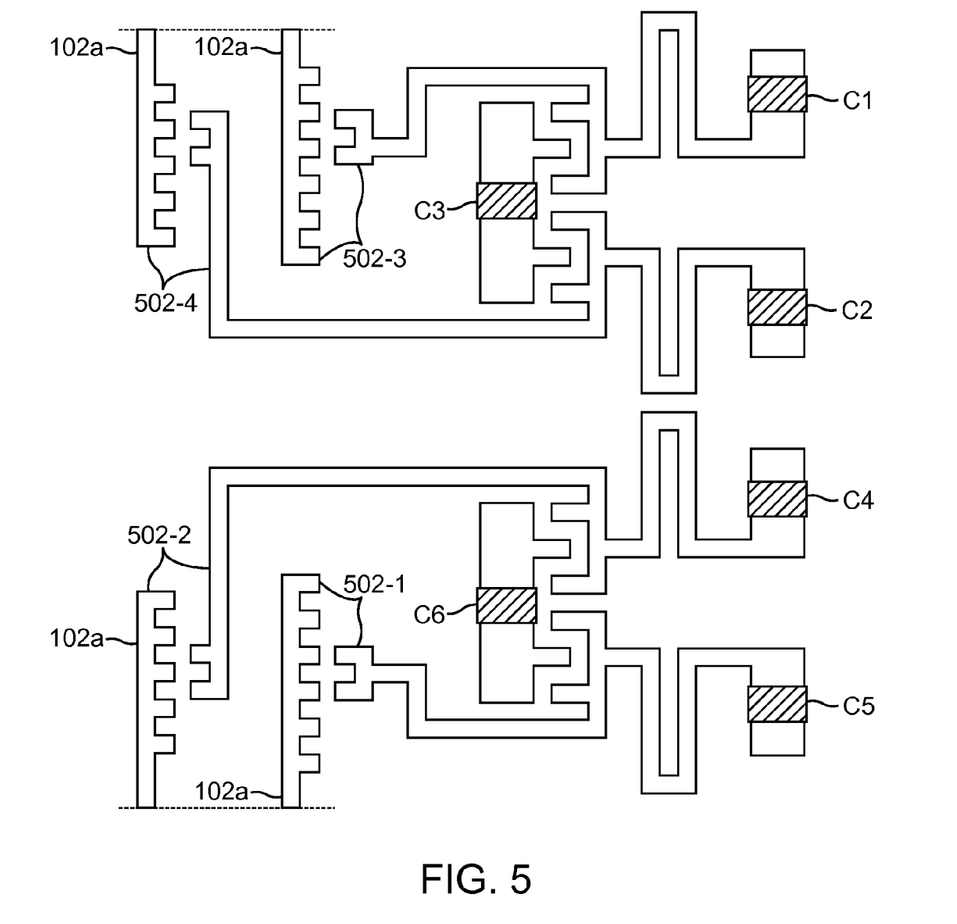
FIG. 5 is an exemplary schematic diagram of a second embodiment of the measuring combs of FIG. 3.

FIG. 5 shows an exemplary schematic diagram of a second embodiment of a measuring combs 102 of FIG. 3. In the alternative configuration of FIG. 5, four teeth sets, 502-1, -2, -3, and -4, may be used having four different alignments, the alignment of each set shifted by a quarter of the distance between adjacent comb teeth. The sinusoidal-like capacitance function is then shifted by 90 degrees, and a Hariharan type algorithm may be applied to find the displacement (x) (described in the measurements section below).

Gap-Closing Sense Array Design

Figure 6:
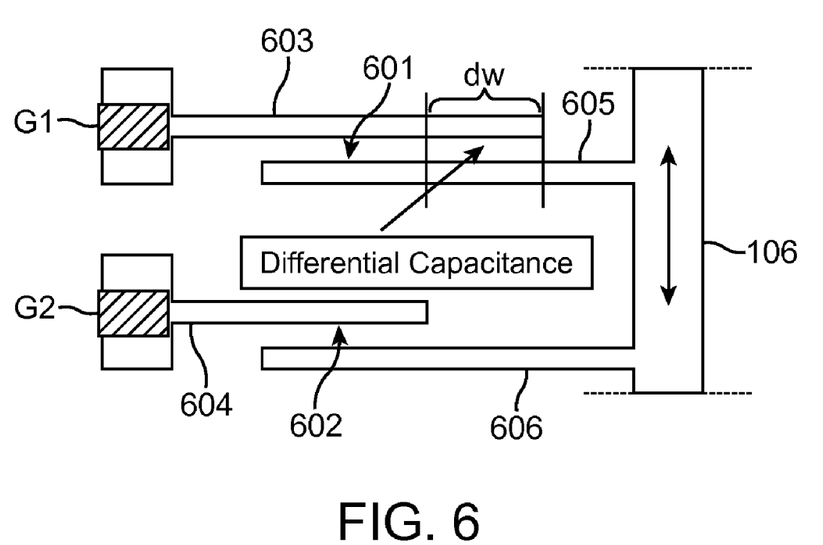
FIG. 6 is an exemplary schematic diagram of an embodiment of the gap closing sense array of FIG. 3.

FIG. 6 shows an exemplary schematic diagram of an embodiment of the gap closing sense array 302 of FIG. 3. An optional gap-closing sense array 302 may be used to further refine the measurements of cut-error and also measure layer thickness. Each gap-closing sensor has two fixed gaps 601 and 602, each defined between a beam of the gap sensor and a beam carried on the shuttle 106. For gap 602, beam 604 of the gap sensor overlaps with beam 606 of the shuttle by a set distance. The second set of beams 603 and 605 overlap by an additional distance, dw, compared to the overlap distance between beams 604 and 606. The differential capacitance between the two sets of beams 604/606 and 603/605 can be used to determine the value of gaps 601 and 602, and therefore cut-error, the method of which is discussed in further detail below. With reference to FIG. 6, G1 and G2 can be tied to A1 if gap-closing sensing is not used (to avoid charging effects). In general, A1's DC offset (if used) should also be applied to G1 and G2.

Drive/Sense Comb-Drive Design

Figure 7:
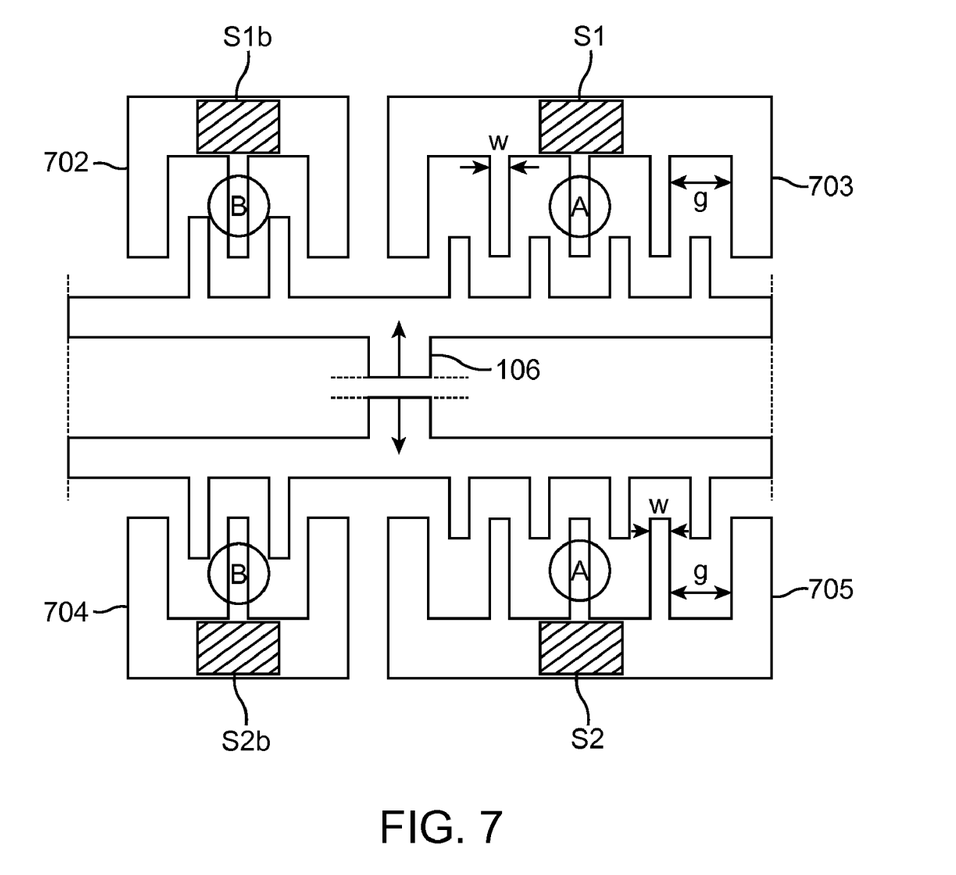
FIG. 7 is an exemplary schematic diagram of the drive/sense comb-drive of FIG. 3.

FIG. 7 shown an exemplary schematic diagram of the drive/sense comb drives (e.g., such as drives 108/110) of FIG. 3. In a balanced configuration, such as that shown in FIG. 7, comb-drives 702/703/704/705 are disposed on both sides of shuttle 106, one of which may be driven while the differential capacitance is sensed between them by combs 102 (not shown). Each comb-drive (e.g., 702 and 703) may have different finger widths, w, and gap spacings, g, between fingers. The finger overlap can be kept small to reduce levitation effects. Comb-drives 704 and 705 on the opposite side of the shuttle 106 may have fewer comb-fingers but more overlap to reduce tilt, or may be identical to the opposing comb-drives 702 and 703, respectively.

Circuit Layout

Figure 8:
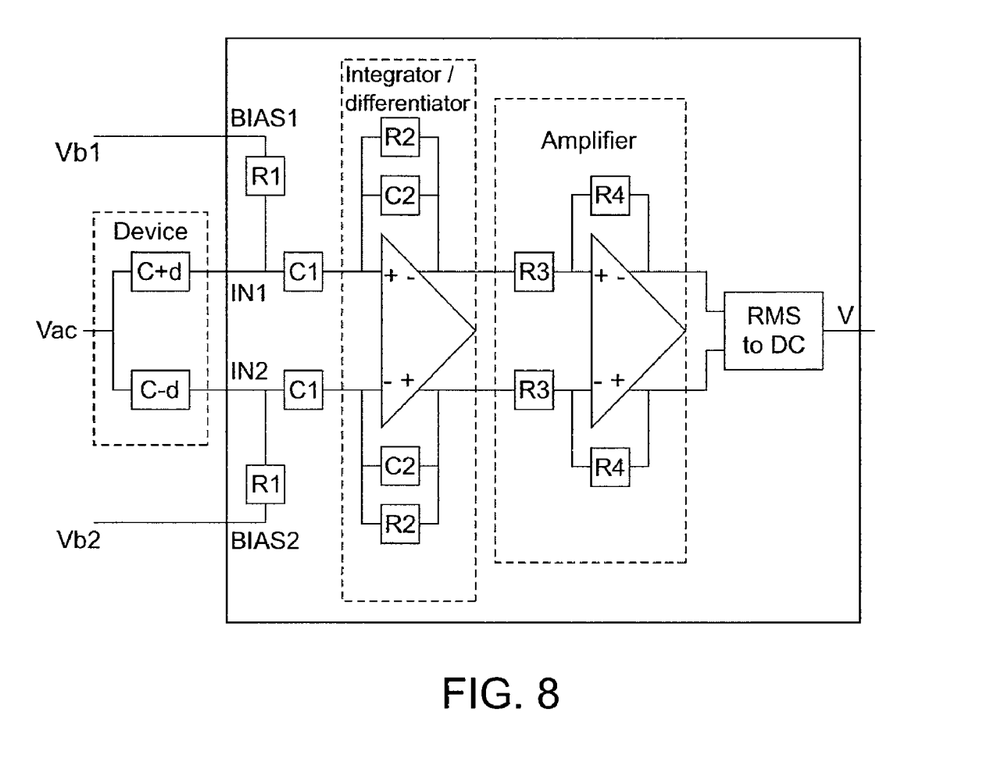
FIG. 8 is an exemplary circuit diagram of the differential sense portion of the device of FIG. 3, and which does not include capacitive bypassing of the power supply.

FIG. 8 shows an exemplary circuit diagram of the differential sense portion of the device of FIG. 3, and which does not include capacitive bypassing of the power supply. In one characterization procedure, sensitive differential capacitance measurements (with a resolution around or below 10 aF) are made while a voltage sweep is supplied to the driving combset. There are two variations for measuring the differential capacitance—one using a charge-integrator scheme and another using a differentiation scheme, both of which can be used by changing capacitors and resistors. In FIG. 8, resistor values are denoted with an "R" and capacitor values are denoted with a "C". In connection with FIG. 8, the signal from the DC biasing (Vb1 and Vb2) is low-pass filtered through resistor, R1, and capacitor, C1 (large). When an integrator is desired, C2 is set to a small capacitive value and R2 is set to a large resistive value. The gain (V/|Vac|) is roughly $2*d/C2$. When a differentiator is desired, C2 is not used, and R2 is set to around a 100 Kohm level. The gain (V/|Vac|) is roughly $2*d*R2*\omega$ (where omega is the frequency of Vac). The second stage amplifier can further be used to amplify the signal. The gain is roughly R4/R3. Additionally, the alternating signal can be converted to a DC signal through an RMS to DC converter.

Figure 9:
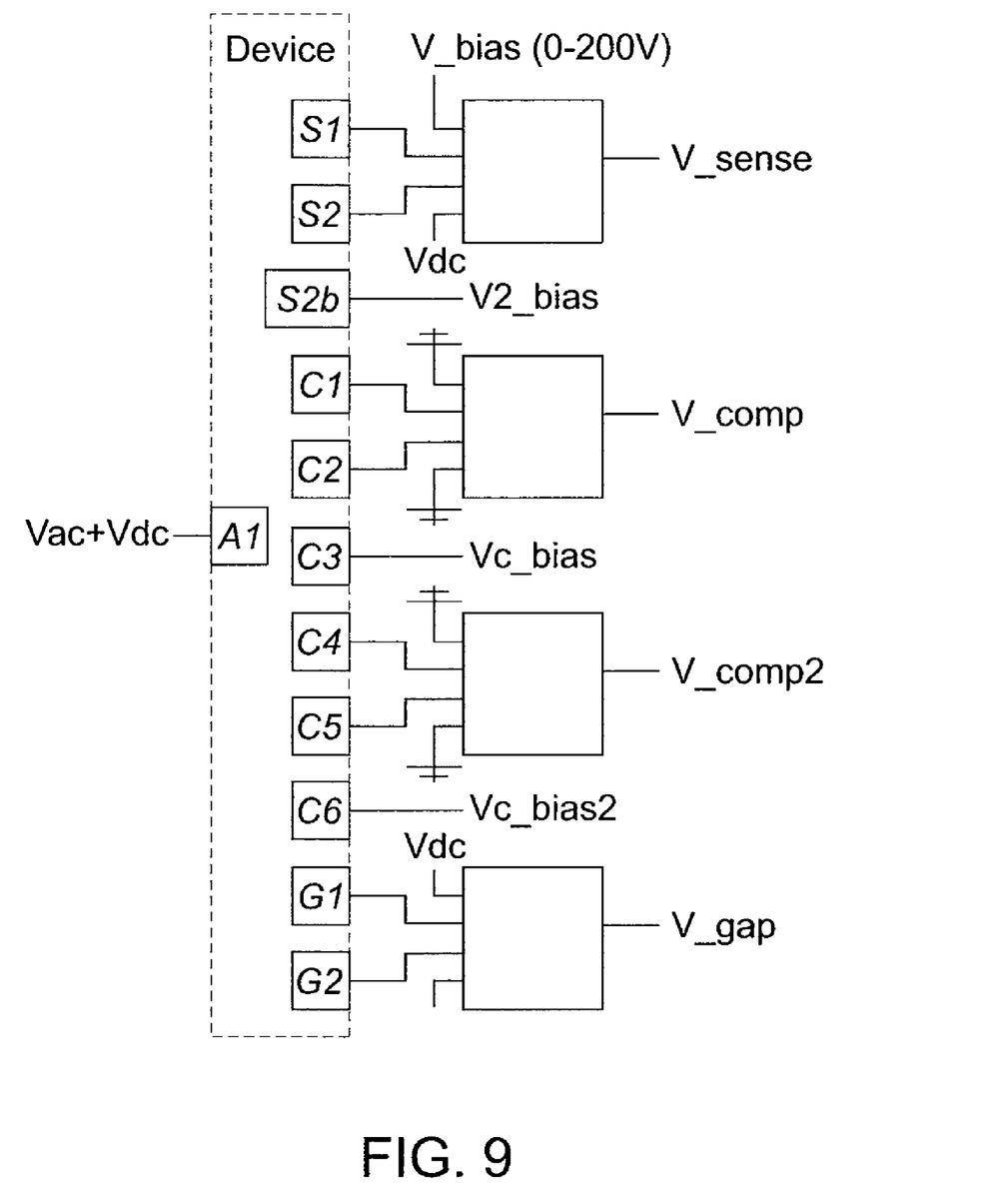
FIG. 9 is an exemplary overall circuit diagram for the device of FIG. 3.

FIG. 9 shows an exemplary overall circuit diagram for the device of FIG. 3. Using the terminal notation from the previous figures, terminals not shown are grounded. Vac is an alternating signal (>200 kHz) applied to the suspension and Vdc is a bias applied to the suspension (and other components) to correct for the levitation effect.

Measurements

Using the systems and circuits of FIGS. 1-9 described above, the MEMS metrology in accordance with the embodiments of the present invention are described below. A first measurement methodology is described first, followed by alternative methodologies that are used to counteract the levitation effect, refine the measuring comb measurements, and refine the measurement of cut error. The description below shows how the comb-drive force (F), cut error (e), and then effective Young's Modulus (E) are measured using capacitance and voltage measurements based on an known layer thickness (h). This methodology includes the following steps:

Step A: The differential sense circuit shown in FIG. 8 is calibrated so that the capacitance, d, is known from a measurement of V (note that there is a factor of 2). An LCR meter such as an HP4824A may be used for this purpose.

Step B: The suspension sweeping V_bias is moved and V_comp as well as V_sense (*) are measured. The V_bias and V_sense values associated with the first peak of V_comp (either a max or min value) are found (it can be more accurate to do this measurement by curve-fitting). Corrections can be made when the output is shifted (due to imperfectly matched capacitances). The values for V_comp may be shifted such that the max and min are equidistant from the origin. Vc_bias is adjusted until the maxima and minima are known to the desired accuracy. The shuttle moves a distance of half the distance (x) between successive complementary-comb teeth. The change of capacitance (dC) can then be determined from the calibration data and V_sense. The force (F) exerted on the suspension is then V_bias$^2$dC/(2*x).

Step C: By using a model of the comb-drive force (F) allows the determination of the cut error (e) from two different comb-drive sets. F is related to the number of fingers (N) of the comb-drive side with fewer comb fingers, finger gap (g) (for simplicity, let $g_e$=g−e), finger width (w), layer thickness (h), and fringing field factor ($\alpha$) as $$F = \frac{\alpha N \varepsilon_0 \varepsilon_{air} h V^2}{g_e}$$

Assuming $\alpha$ and e remain nearly constant, two different comb-drive sets can be used with varying layout gaps, $g_1$ and $g_2$, and number of fingers, $N_1$ and $N_2$. Using step B, the V_bias bias voltages, $V_1$ and $V_2$, are found for the two sets that generate the same force (same displacement). Cut error is then computed as $$e = \frac{N_1 V_1^2 g_2 - N_2 V_2^2 g_1}{N_2 V_2^2 - N_1 V_1^2}$$

Step D: The effective Young's Modulus may be computed as $$E = \frac{F(l+e)^3}{2xh(w-e)^3}$$

where l is the cantilever length, and w is the cantilever width.

It should be noted that in step B, if and when the complementary teeth are tightly packed in the configuration in FIG. 4, then set Vc_bias=0 and measure the complementary-comb signal, V_comp0, as V_bias is swept. As Vc_bias is adjusted, the sweep data is subtracted from the original sweep (this subtraction will remove global effects), (V_comp−V_comp0).

To measure the actual Young's Modulus, two separate suspensions may be used, one with a differing cantilever width. The stiffness due to beam-anchor compliance and webbing effects can then be determined using the relationship: K=Kweb_compliance+Ksuspension.

Correcting for the Levitation Effect

To correct for levitation effects, the optional comb-sets (B in FIG. 7) can be used. For each biasing voltage, V_bias, the following steps are taken to remove levitation effects.

A. Apply bias to V2_bias until |V_comp| is maximized.
B. Apply bias to Vdc until |V_comp| is maximized.

Refining the Cut Error Measurements

The cut error for differing geometries can also be measured using a gap-closing actuator shown in FIG. 6. This arrangement can provide for more accuracy. The measurement includes the following steps:

A. As V_bias is swept, measure V_gap.
B. Use the calibration data to convert V_gap to capacitance, C_gap.
C. Use the complementary-comb data to convert V_bias to the translation, x.
D. Fit the data to C_gap=$\alpha \epsilon_0 \epsilon_{air}$A/($g_{model}$−x). ($\alpha \epsilon_0 \epsilon_{air}$A is constant)
E. Cut error is then $g_{model}$−g.
F. A short set (3-5 microns in length) of gap-closing sensors may be used as gap stops to allow the determination of the sidewall angle. The cut-error determined in step E is near the midpoint of the layer. Actuate the shuttle until the gap is reached. Measure the displacement, $g_{bottom}$, using the V_sense data. The sidewall angle is approximately ($g_{bottom}$−$g_{model}$)/(h/2).
G. Similarly, as the gap is closed, the fringing-field effect is reduced. At the point where the fringing-field effect is sufficiently reduced, the layer thickness, h, may be measured by finding the area A (from step D) and dividing by the layout protruding length (it is not affected by cut error).

Refining the Complementary-Comb Measurements

When the alternative approach shown in FIG. 5 is taken, then refinements can be made to the comb-drive sensing device. V_comp and V_comp2 will be 2 periodic functions (of displacement which is proportional to V_bias$^2$). They will also be 90 degrees out of phase with one another. The minima and maxima can be found when the function atan(V_comp2/V_comp) crosses multiples of pi. Near these regions, the data can be linearly fit to determine this crossing value precisely. Note that the atan function must be unwrapped (when values cross pi, they jump to −pi) and at that point, 2*pi is added to the results to make them continuous).

Fabrication

Figure 10A:
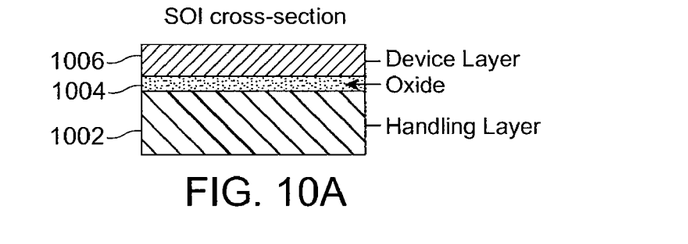
FIGS. 10A-E are exemplary device stack schematic drawings showing an embodiment of the fabrication of the MEMS metrology device in accordance with the embodiments of the present invention.
Figure 10B:
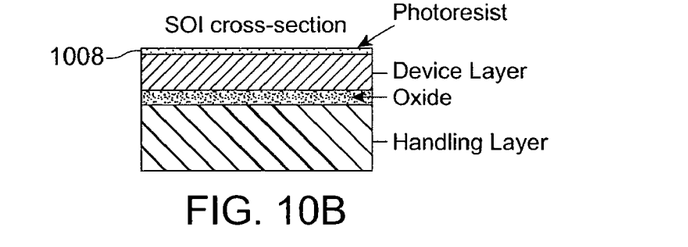
Figure 10C:
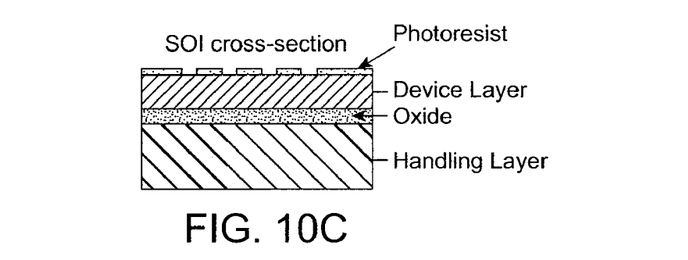
Figure 10D:
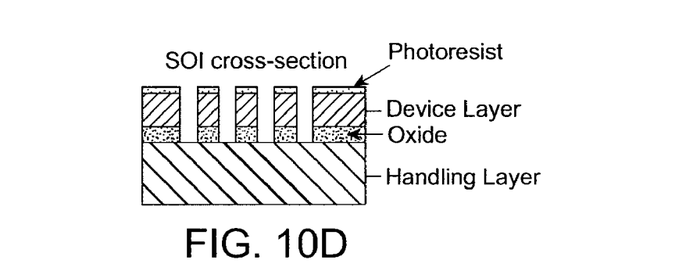
Figure 10E:
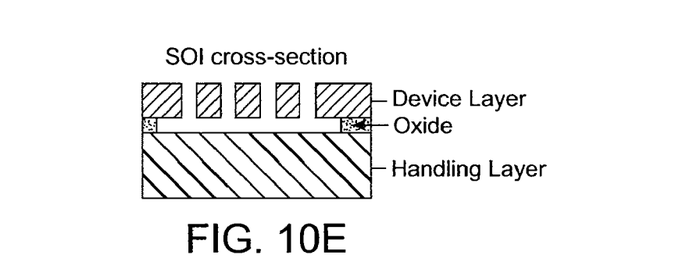

The MEMS metrology device in accordance with the embodiments of the present invention can be fabricated using a silicon-on-insulator substrate from a single mask, as shown in FIGS. 10A-E. As is shown in FIGS. 10A-E, the fabrication process includes the following steps. The fabrication of the device starts with a handling layer 1002 that has disposed on it an oxide layer 1004 that in turn has a device layer 1006 disposed on it (FIG. 10A). Next, a photoresist layer 1008 is deposited on the device layer 1006 (FIG. 10B). Next, the photoresist layer 1008 is patterned (FIG. 10C). Then the device layer 1006 and the oxide layer 1004 are etched (FIG. 10D) and then the device layer 1006 is released by the removal of the oxide layer 1004 (FIG. 10E), to form the finger-like structures of FIG. 1. For example, the device shown in FIG. 1 is approximately 25-50 μm thick, has a foot print of approximately 1.5 mm by 1.0 mm, or preferably less than 1.0 mm by 1.0 mm. The MEMS metrology device in accordance with the embodiments of the present invention can be fabricated during the same fabrication process and formed adjacent to the MEMS device which will be monitored by the metrology device. The metrology device can then be used to measure both the under or over-cut of the device and also monitor its material, process, geometry and dynamic properties of MEMS device. Prototype MEMS metrology devices have been demonstrated to be inexpensive, reliable and accurate, having resolutions better than or similar to the resolution of optical microscopy device and nearing SEM device resolutions. Furthermore, due to the symmetric nature of over- or under-cut the deflection measurements of the MEMS metrology devices are resilient to the variation of comb tips. Such comb-tip variations include variations due to cut error resulting in narrower or wider combs; variations due to the filleting where combs are shortened and rounded; and cross-sectional variations.

As will be understood by those skilled in the art, the present invention may be embodied in other specific forms without departing from the essential characteristics thereof. These other embodiments are intended to be included within the scope of the present invention, which is set forth in the following claims.

What is claimed is:

1. A device for in-situ monitoring of material, process and dynamic properties of a MEMS device, comprising:
   at least two comb drives configured to displace a translating shuttle operatively connected to the comb drives based on an electrical potential applied to each of the comb drives;
   a plurality of complementary measuring combs operatively connected to the shuttle for measuring a displacement of the shuttle, each comb of the plurality facing a complementary comb without overlapping; and
   means for measuring the electrical potential applied to each of the comb drives.

2. The device of claim 1, wherein the at least two comb drives are each configured with differently sized comb finger gaps.

3. The device of claim 2, wherein the at least two comb drives are each configured with a different number of comb finger gaps.

4. The device of claim 1, wherein the at least two comb drives are both disposed on one side of the shuttle.

5. The device of claim 4, further comprising additional comb drives disposed on the other side of the shuttle.

6. The device of claim 1, wherein the plurality of measuring combs comprise a set of two opposing combs, each comb including a set of comb teeth, a first comb being anchored in place and a second comb being operatively connected to the shuttle and configured to move past the anchored first comb.

7. The device of claim 6, wherein the sets of opposing comb teeth are disposed such that the opposing comb teeth are aligned in an initial state.

8. The device of claim 6, wherein the sets of opposing comb teeth are disposed such that the opposing comb teeth are misaligned in an initial state.

9. The device of claim 6, wherein the plurality of measuring combs further comprise a second set of two opposing combs, wherein one set of opposing combs comprises comb teeth that are aligned in an initial state and the other set of opposing combs comprises comb teeth that are misaligned in an initial state.

10. The device of claim 6, further comprising a complementary comb drive for driving the two opposing combs closer together to increase measurement sensitivity.

11. The device of claim 1, further comprising means for measuring an electrical capacitance of the measuring combs.

12. The device of claim 1, further comprising a gap closing sense array.

13. The device of claim 1, wherein the shuttle is mounted on two cantilevers perpendicularly disposed with the shuttle, wherein the cantilevers act as springs to return the shuttle to its initial position after each displacement.

14. The device of claim 1, wherein the device is formed adjacent to the MEMS device being monitored.

15. A method for in-situ monitoring of material, process and dynamic properties of a MEMS device, comprising:
   forming a monitoring device adjacent to the MEMS device, said monitoring device comprising:
      at least two comb drives configured to displace a translating shuttle operatively connected to the comb drives based on an electrical potential applied to each of the comb drives, and
      a plurality of complementary measuring combs operatively connected to the shuttle for measuring a displacement of the shuttle, each comb of the plurality facing a complementary comb without overlapping;
   actuating a first one of the comb drives to displace the shuttle; and
   measuring an electrical capacitance of the measuring combs to determine when the displacement of the shuttle has reached a set distance.

16. The method of claim 15, further comprising:
   measuring a first electrical potential placed on the first comb drive to accomplish the displacement of the shuttle by the set distance;
   actuating a second one of the comb drives to displace the shuttle; and
   measuring the electrical capacitance of the measuring combs to determine when the displacement of the shuttle has reached the set distance; and
   measuring a second electrical potential placed on the second comb drive to accomplish the displacement of the shuttle by the set distance.

17. The method of claim 15, further comprising measuring an electrical capacitance of the first comb drive while the second comb drive is displacing the shuttle by the set distance.

18. The method of claim 15, wherein forming a monitoring device further comprises forming each of the at least two comb drives with differently sized comb finger gaps.

19. The method of claim 15, wherein forming a monitoring device further comprises forming each of the at least two comb drives with a different number of comb finger gaps.

20. The method of claim 15, wherein forming a monitoring device further comprises forming the shuttle on two cantilevers perpendicularly disposed with the shuttle, wherein the cantilevers act as springs to return the shuttle to its initial position after each displacement.

* * * * *